US009545021B2

(12) United States Patent
Evans

(10) Patent No.: US 9,545,021 B2
(45) Date of Patent: Jan. 10, 2017

(54) MAT WITH CABLE MANAGEMENT FOR ELECTRONIC DEVICES

(71) Applicant: Lee Chiang Evans, Los Angeles, CA (US)

(72) Inventor: Lee Chiang Evans, Los Angeles, CA (US)

(*) Notice: Subject to any disclaimer, the term of this patent is extended or adjusted under 35 U.S.C. 154(b) by 0 days.

(21) Appl. No.: 14/477,757

(22) Filed: Sep. 4, 2014

(65) Prior Publication Data

US 2015/0060610 A1 Mar. 5, 2015

Related U.S. Application Data

(60) Provisional application No. 61/873,840, filed on Sep. 5, 2013.

(51) Int. Cl.
| *F16L 3/00* | (2006.01) |
| *H05K 5/02* | (2006.01) |
| *H04B 1/16* | (2006.01) |
| *H04M 1/04* | (2006.01) |

(52) U.S. Cl.
CPC .......... *H05K 5/0204* (2013.01); *H04B 1/1607* (2013.01); *H04M 1/04* (2013.01)

(58) Field of Classification Search
None
See application file for complete search history.

(56) References Cited

U.S. PATENT DOCUMENTS

| 2,253,063 | A | * | 8/1941 | Deibel | ............... | A63B 69/0079 |
| | | | | | | 473/144 |
| 6,195,935 | B1 | * | 3/2001 | Bellucci | ............. | A01G 13/0281 |
| | | | | | | 47/9 |
| 2004/0048511 | A1 | * | 3/2004 | Dayan | .................... | H01R 13/22 |
| | | | | | | 439/493 |
| 2004/0065656 | A1 | * | 4/2004 | Inagawa | ............. | C23C 16/4586 |
| | | | | | | 219/444.1 |
| 2009/0056970 | A1 | * | 3/2009 | Hoffman | .................. | H02G 3/00 |
| | | | | | | 174/66 |
| 2009/0152427 | A1 | * | 6/2009 | Kuo | ...................... | A47G 1/0633 |
| | | | | | | 248/346.01 |
| 2014/0239888 | A1 | * | 8/2014 | Chen | ....................... | H02J 7/025 |
| | | | | | | 320/108 |
| 2015/0303736 | A1 | * | 10/2015 | Eckerson | ............. | H02J 7/0044 |
| | | | | | | 320/108 |

* cited by examiner

*Primary Examiner* — Amy Sterling
(74) *Attorney, Agent, or Firm* — Trellis IP Law Group, PC

(57) ABSTRACT

Embodiments of the invention provide a mat upon which can be placed an electronic device. A cable is routed through a channel that is at least partially inside the mat. One end of the cable connects to the electronic device while the other end can exit the mat through, for example, an opening in the mat's edge, or other opening. Multiple devices and cables can be accommodated. Figures provided herein illustrate different types of mat and channel designs. Other designs are possible.

4 Claims, 21 Drawing Sheets

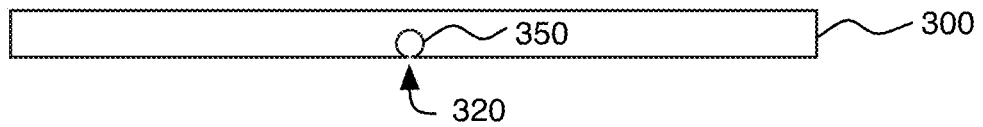
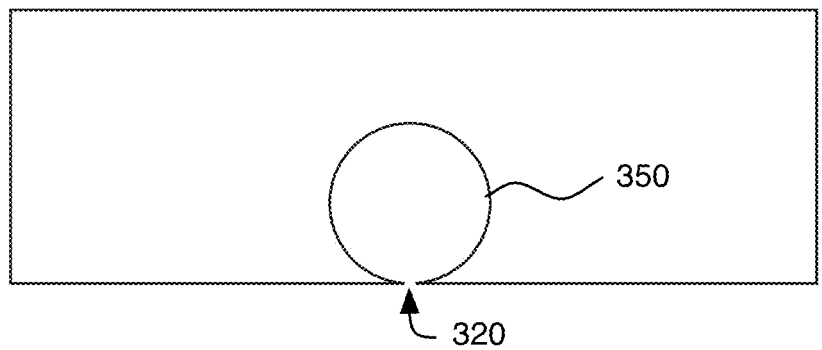
Figure 4

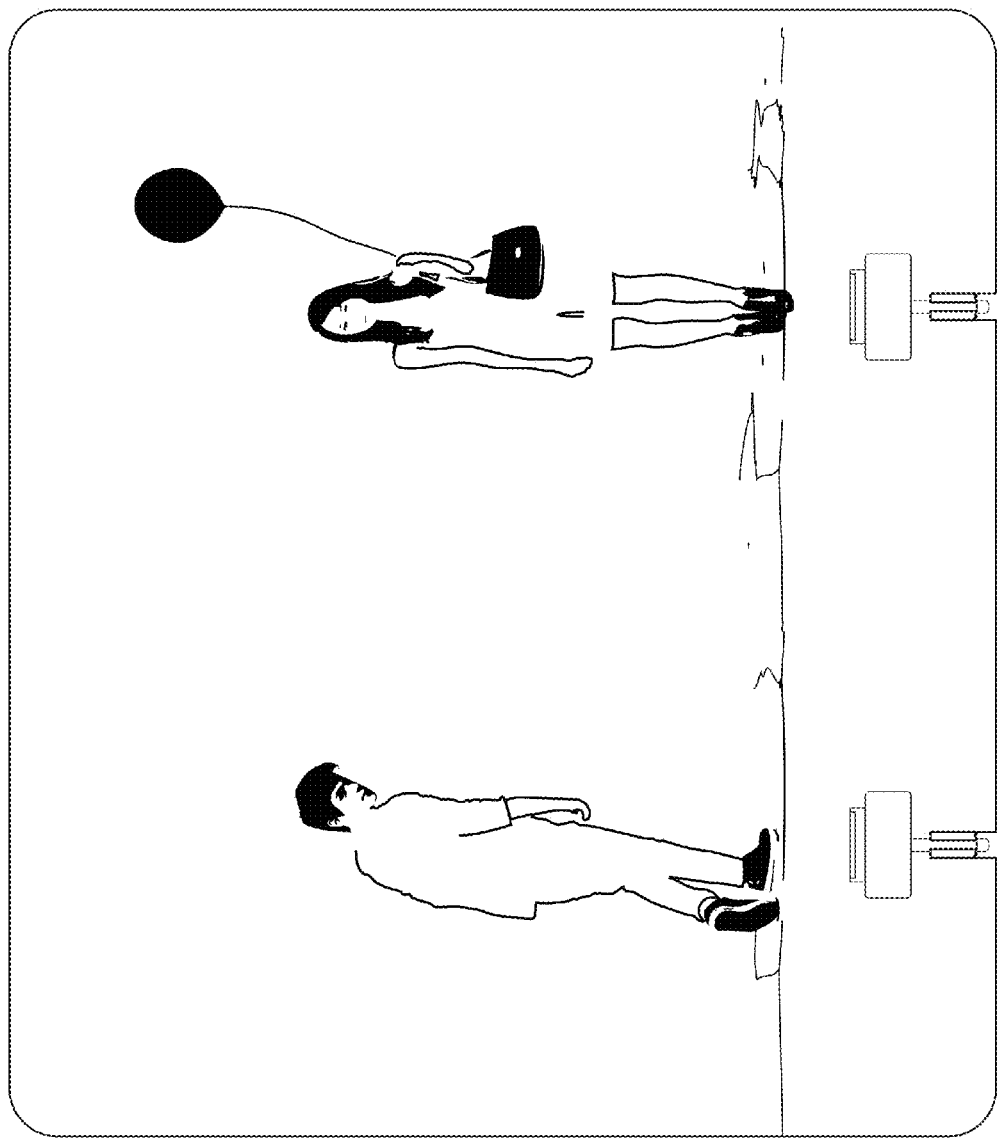

MAT WITH CABLE MANAGEMENT FOR ELECTRONIC DEVICES

CROSS-REFERENCE TO RELATED APPLICATIONS

This application claims priority from U.S. Provisional Patent Application Ser. No. 61/873,840, entitled CABLE MANAGEMENT AND CHARGING MAT FOR ELECTRONIC DEVICES, filed on Sep. 5, 2013, which is hereby incorporated by reference as if set forth in full in this application for all purposes.

FIELD OF THE INVENTION

This invention relates in general to electronic devices and more specifically to a mat that includes interior channels for routing of cables to and from the devices.

BACKGROUND

Consumer electronic devices such as mobile phones, tablets, gaming systems, audio players, cameras, etc. are prevalent in today's society. These devices are often intended for portable or handheld use but are frequently placed on a surface such as a desk, table, nightstand, etc. Such placement upon surfaces can be to connect the device via a hardwired cable in order to, for example, charge the device, connect the device to a larger speaker or to another device, or for other purposes.

When a device is placed on a surface and connected to a cable, the routing of the cable to or from the device can be awkward and/or unsightly. Placing multiple devices in a small area can compound the problems.

SUMMARY

Embodiments of the invention provide a mat upon which can be placed an electronic device. A cable is routed through a channel that is at least partially inside the mat. One end of the cable connects to the electronic device while the other end can exit the mat through, for example, an opening in the mat's edge, or other opening.

Multiple devices and cables can be accommodated. Figures provided herein illustrate different types of mat and channel designs. Other designs are possible.

BRIEF DESCRIPTION OF THE DRAWINGS

FIG. 4 shows a cross-sectional view of an example of enclosed channels;

FIGS. 16-21 illustrate various graphic designs on the mats.

DETAILED DESCRIPTION

Figure 1:
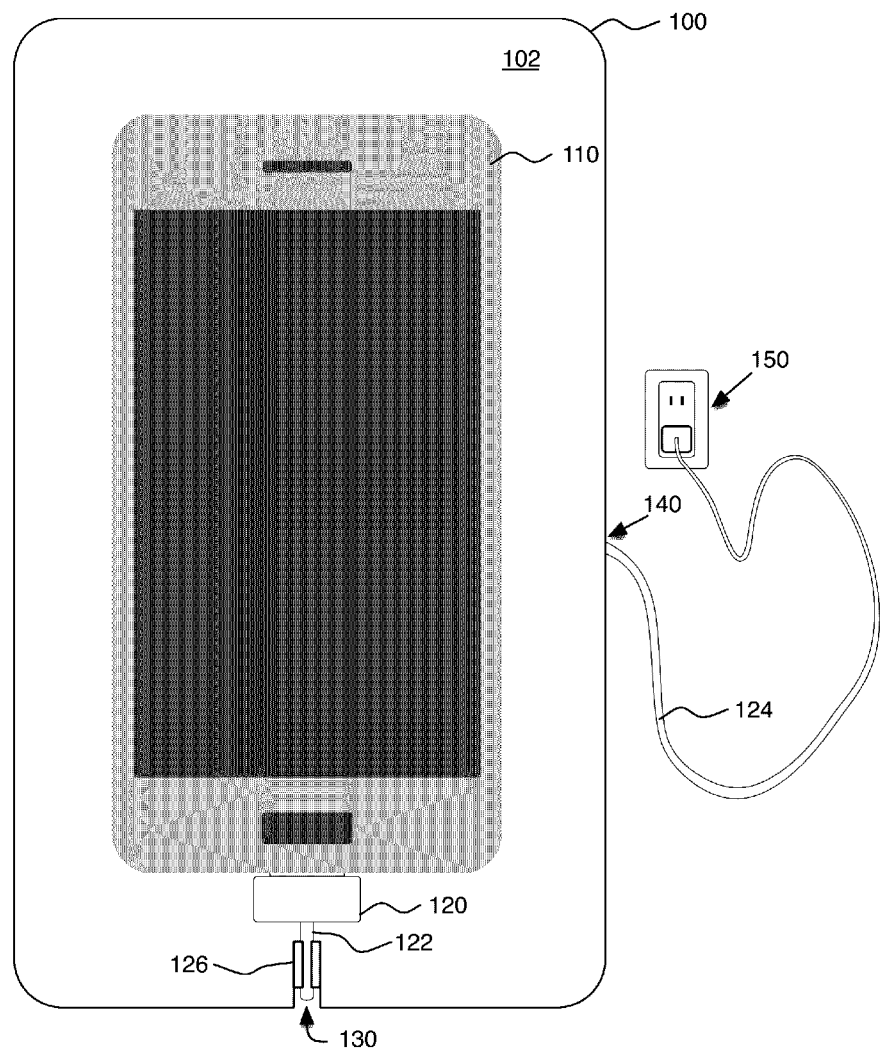
FIG. 1 illustrates a device on the mat.

FIG. 1 illustrates mat 100 with top surface 102, upon which is placed electronic device 110. Connector 120 is attached to the device so that the connector can be inserted or moved with a human hand. Connector end 122 of cable 124 is electrically coupled to connector 120. A portion of the cable can be held close to the mat by use of an optional clip 126. The cable enters the mat structure at entry point 130. Connector 120 is electrically coupled to the device, when attached, so that when the connector is inserted into the device an electrical connection using one or more conductors within the connector and cable is established. Cable 124 exits mat 100 at exit point 140 and attaches to a power source such as wall outlet 150. In the illustrated embodiment, exit point 140 is an edge opening in the mat. In other embodiments it is possible for the cable to exit at a surface similar to cable 124 at entry point 130 at the top surface of the mat.

In this example, cable 124 serves as a charging cord to replenish the charge in one or more batteries in the device in a manner that is known in the art. It should be apparent that many different types of cables that perform different functions may be similarly employed. For example, a cable can plug into an audio jack of the device and be routed to an external speaker. A network data connection such as Ethernet, Firewire®, etc. can be used. Video signal cables such as HDMI can be used. In general, any type of cable can be sufficiently adapted for use in different embodiments. By allowing routing of cables under or within the mat, the cables can be held in place and concealed from view. This approach can provide convenience to the user while preserving the aesthetic of a neat and organized arrangement.

Different types of devices may be used with the mat. The size and shape of the mat can vary according to a particular device or type of device. Multiple devices may be placed on the mat and multiple cables can be attached to the various devices, as desired. Although specific shapes, sizes and types of materials and structures may be described in reference to particular embodiments or examples, it should be understood that many other shapes, sizes, types and other characteristics can be modified without departing from the scope of the invention.

In a particular embodiment the mat can be made of soft, flexible plastic or rubber materials such as silicone, neoprene or polyurethane. In a particular embodiment, a material such as neoprene with a substantial coefficient of friction is used so that the mat will not slip around on the surface of furniture such as on a wood or glass surface of a table or dresser. Similarly, the surface of the mat is designed to be soft so that the device is not scratched and have similar friction so that the device will not easily slide on the mat. In other embodiments different types of material can be used. The mat can be made slick or slippery on one side or both sides, as desired. Mats can be manufactured with different degrees of softness, stiffness, friction, dimensions or other characteristics. Multiple of such characteristics can be combined in a single mat, as desired. In other words, a mat can have different degrees of stiff/flexible, slippery/tacky, or other characteristics in different areas of a particular mat. In general, any suitable types of materials can be used.

The mat need not be uniformly flat. Depressions or protrusions may be used for various purposes. For example, an indentation or depression might prevent a device such as a phone from sliding out of place, or from sliding off the mat, especially when using a material that doesn't provide higher friction such as food-grade silicone. The mat could also have a depression to allow for easy grabbing of the phone where a user's fingers could "scoop" the phone up rather than pinching the sides. Similarly, protrusions can be used to keep a device in place, or to prevent a device from moving past the edge of the mat. Other design variations are possible.

Figure 2:
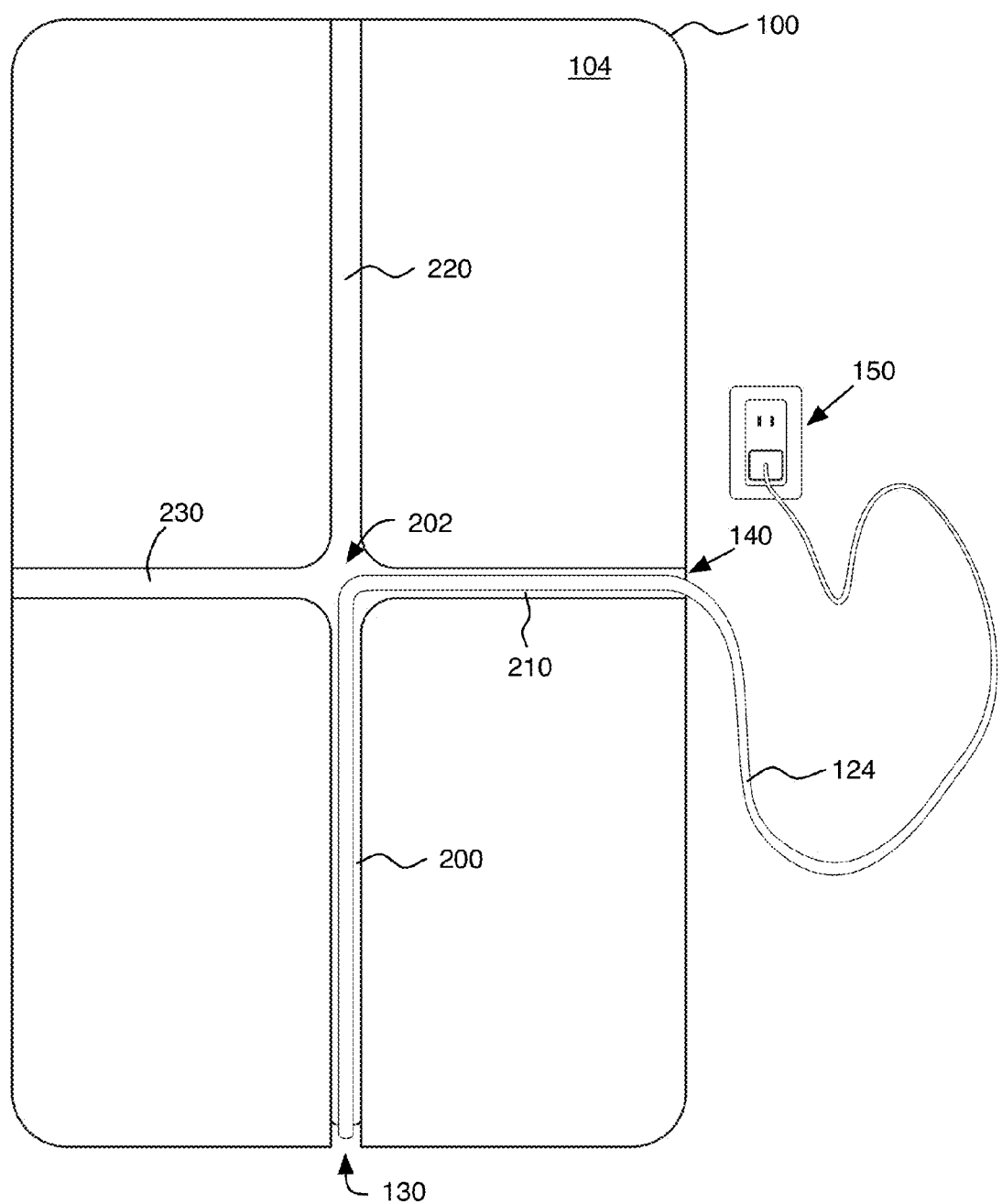
FIG. 2 shows the underside of the mat of FIG. 1 including open channels and a notch cutout.

FIG. 2 shows the underside of mat 100 of FIG. 1 having bottom surface 104. Channels such as 200, 210, 220 and 230 are cutouts in the bottom of the mat. This allows cable 124 to be routed through the interior of mat 100. Cable 124 enters mat 100 at entry point 130 which, in this example, is a notch cutout. The cable is then is routed along channel 200 to channel hub area 202. The cable is bent at channel hub area 202 to run at 90 degrees through channel 210. The cable exits the channels and mat at exit point 140 to connect to power outlet 150.

Figure 3:
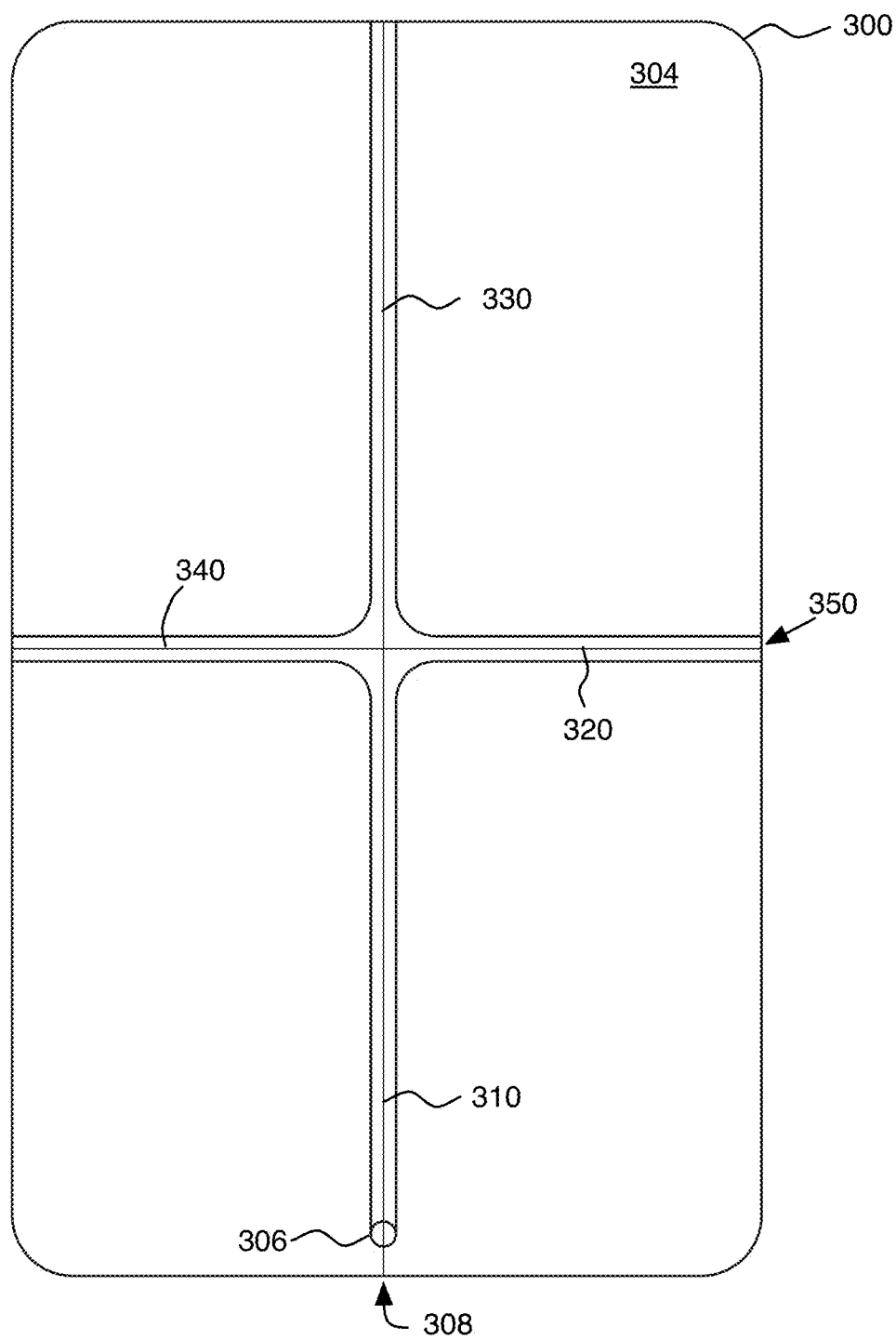
FIG. 3 shows an underside of a mat with enclosed channels and a hole.

FIG. 3 shows another example of routing through the mat from the top surface to the bottom surface. In this case, hole 306 serves as an entry point for the cable (not shown). The cable can be run through the hole by using slit 308 which allows the cable to be pushed from the edge of the mat to the hole.

FIG. 4 shows a cross-section of mat 300 that includes interior channel 350 and lengthwise channel slit 320. An expanded view of these features is also provided. This approach allows the cable to be routed inside of the mat by pressing the cable through the slit. All or a portion of the channel routing can be placed interior to the mat with this approach.

Figure 5:
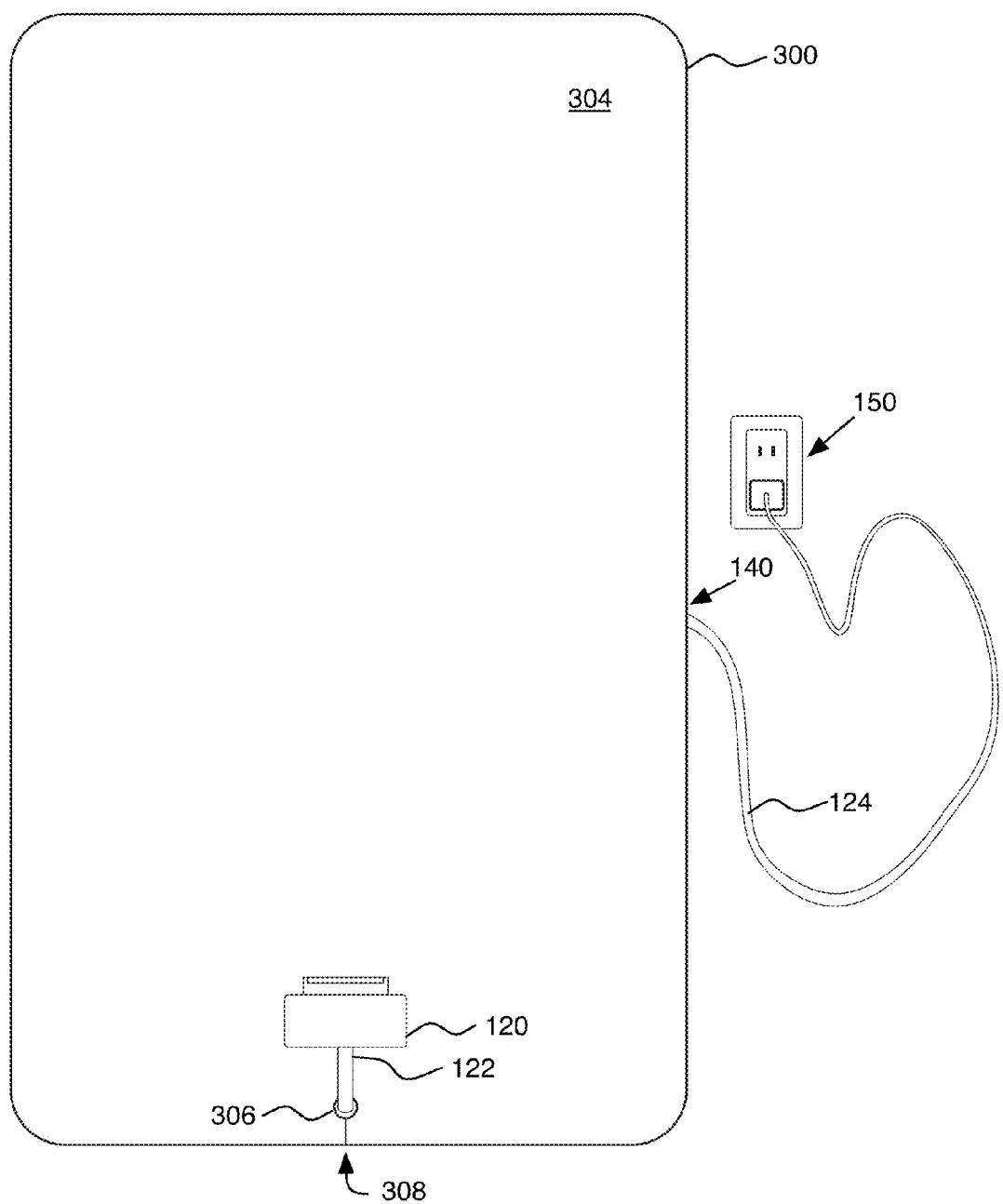
FIG. 5 shows a top view including connector and cable and a hole entry point.
Figure 6:
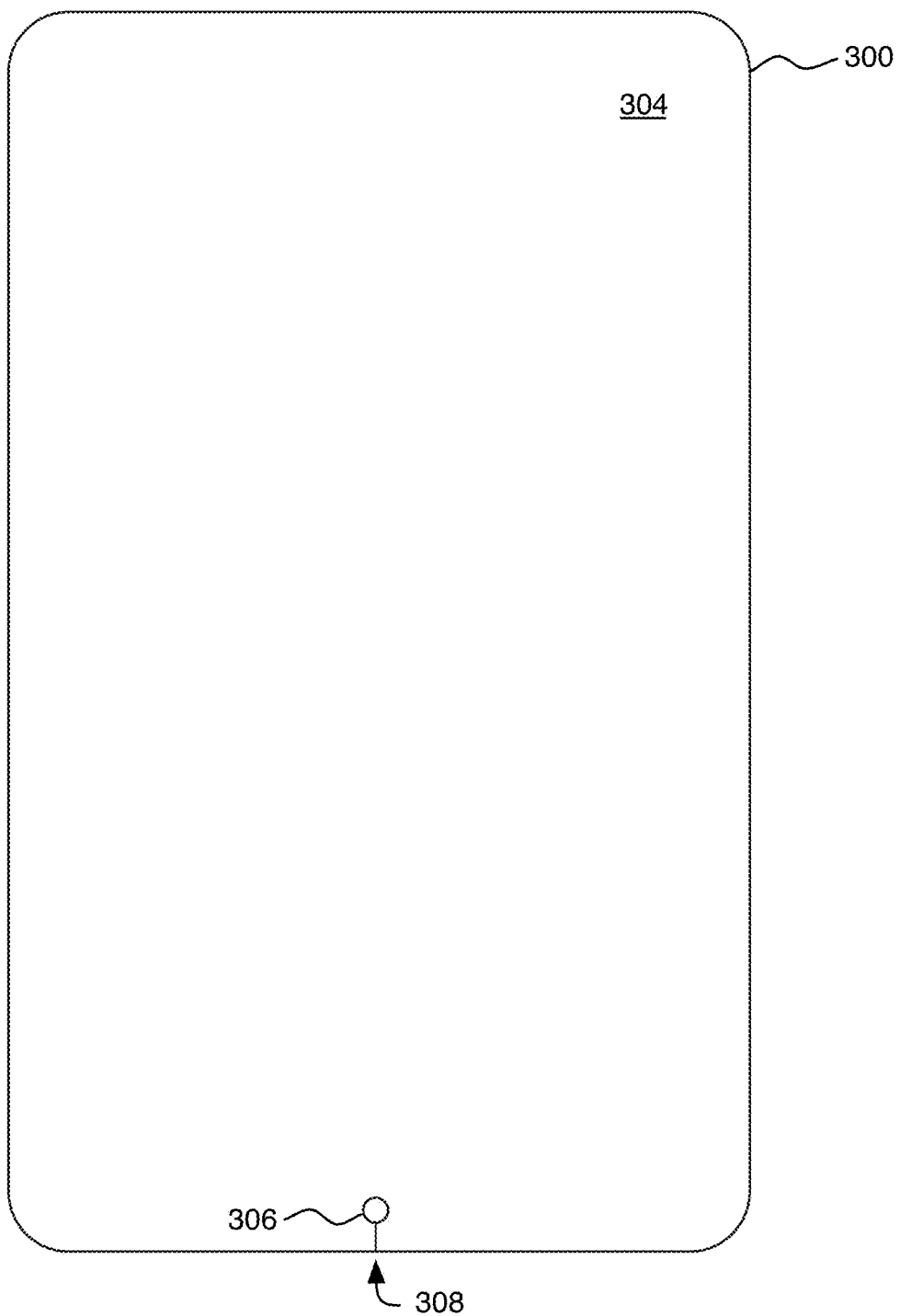
FIG. 6 shows a bottom view including a hole entry point.

FIG. 5 shows connector 120 having cable 122 that is being routed through hole 306. Cable 122 has been pushed through slit 308 in order to reach hole 306. In some embodiments, it may not be necessary to provide slit 308 as, for example, where connector 120 can be detached from cable 122. FIG. 6 shows the mat of FIG. 5 without the cable and connector.

Figure 7:
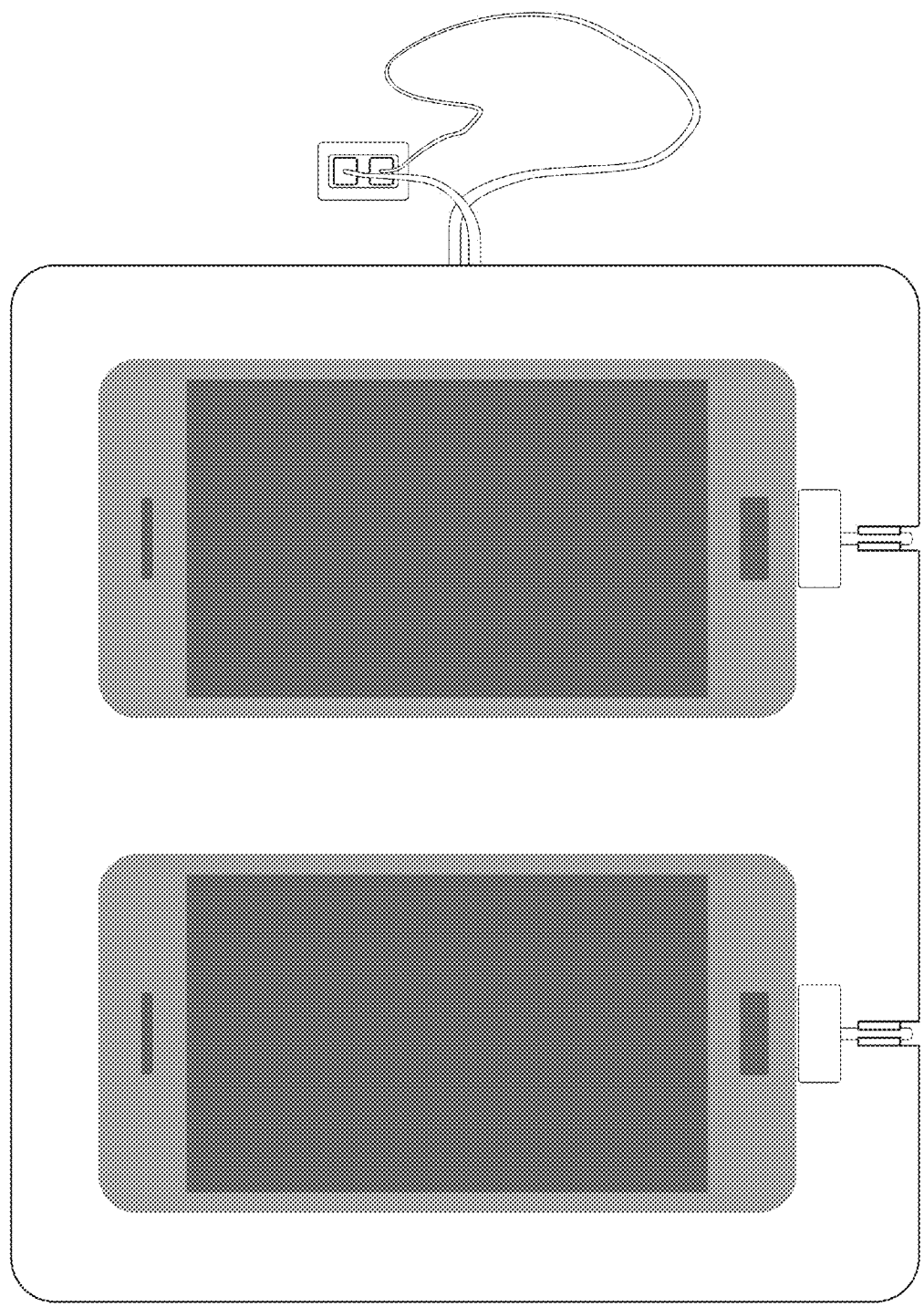
FIG. 7 illustrates a top view of two devices on a dual device mat.
Figure 8:
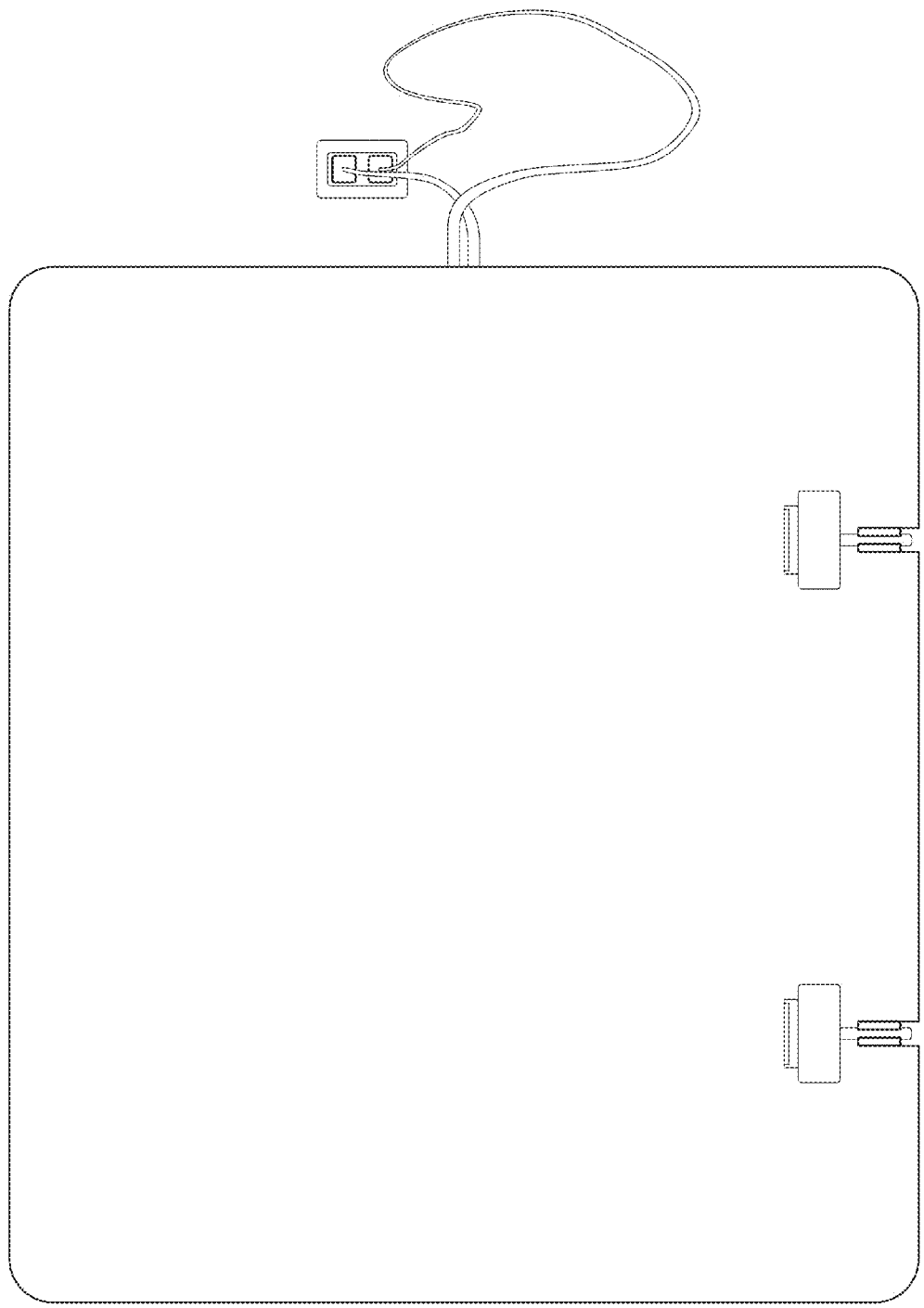
FIG. 8 shows a top view of a dual device mat.
Figure 9:
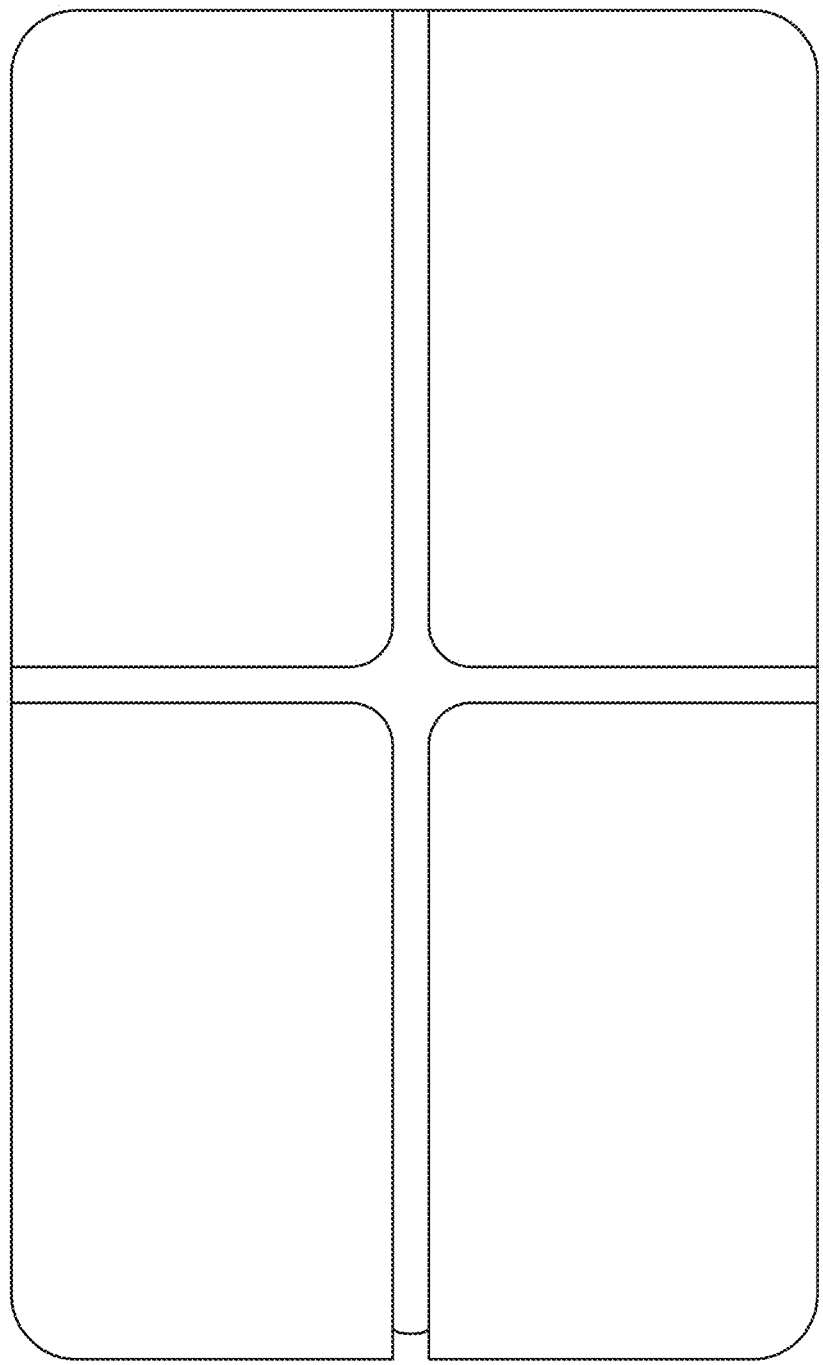
FIG. 9 shows a bottom view with a notch cutout.
Figure 10:
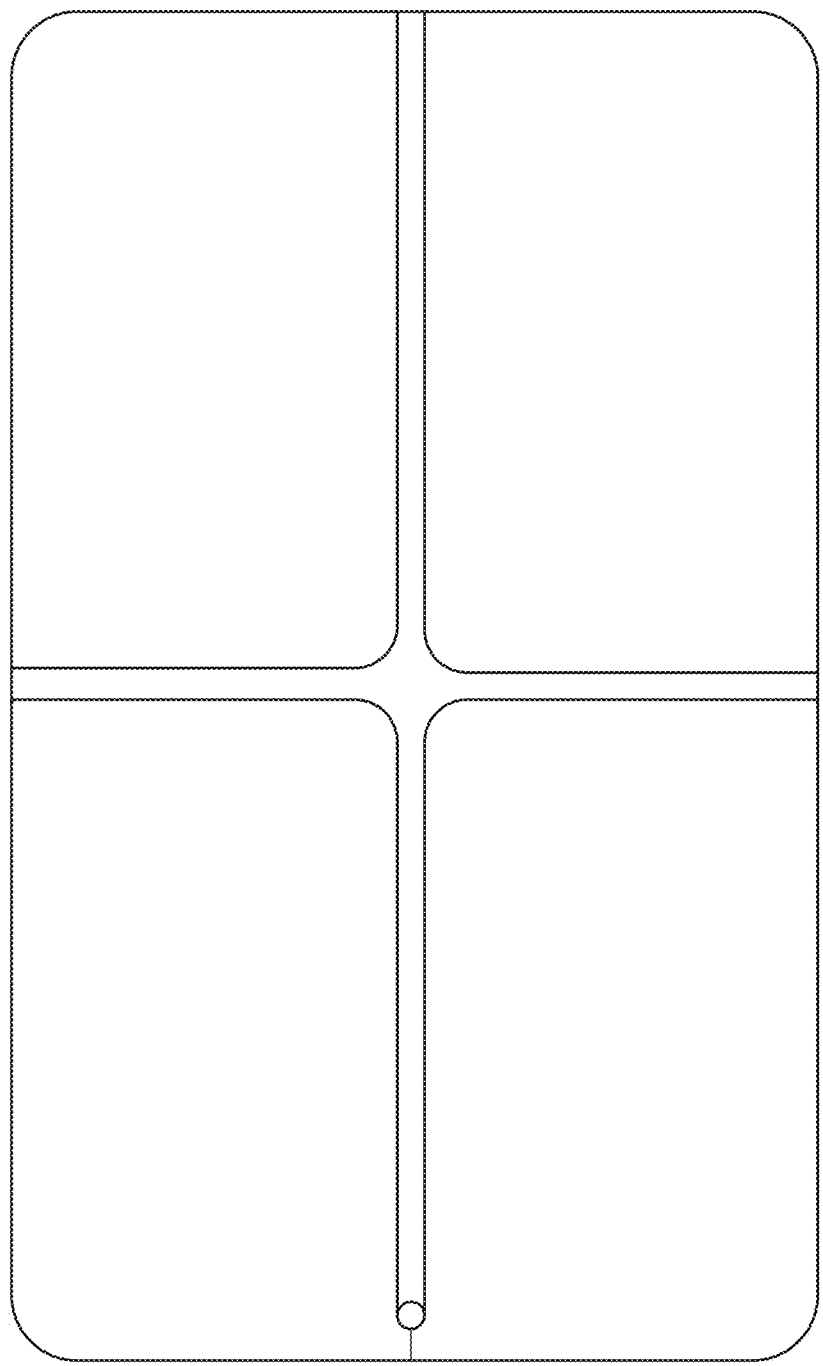
FIGS. 10 and 11 show bottom views including a hole cutout.
Figure 11:
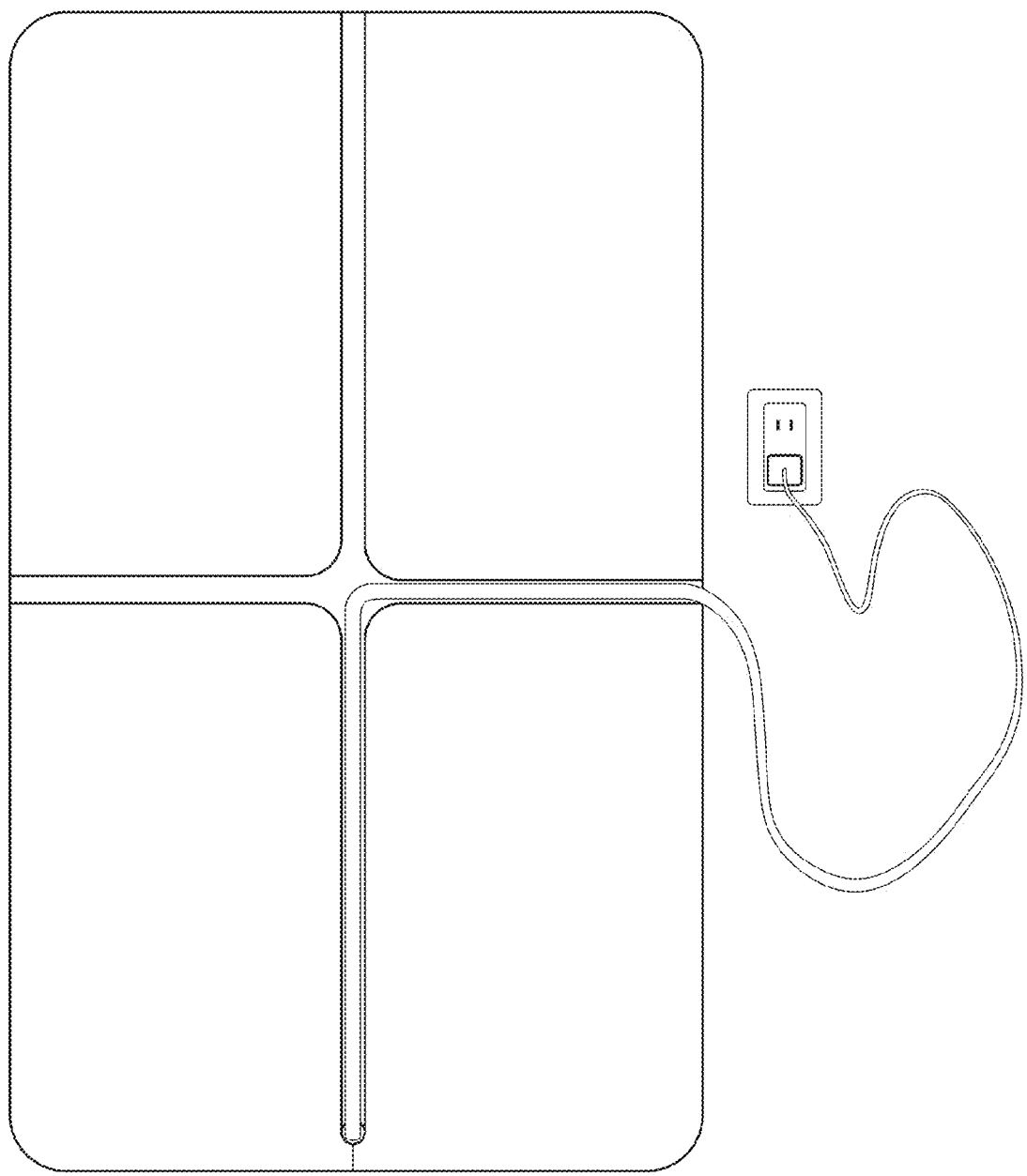
Figure 12:
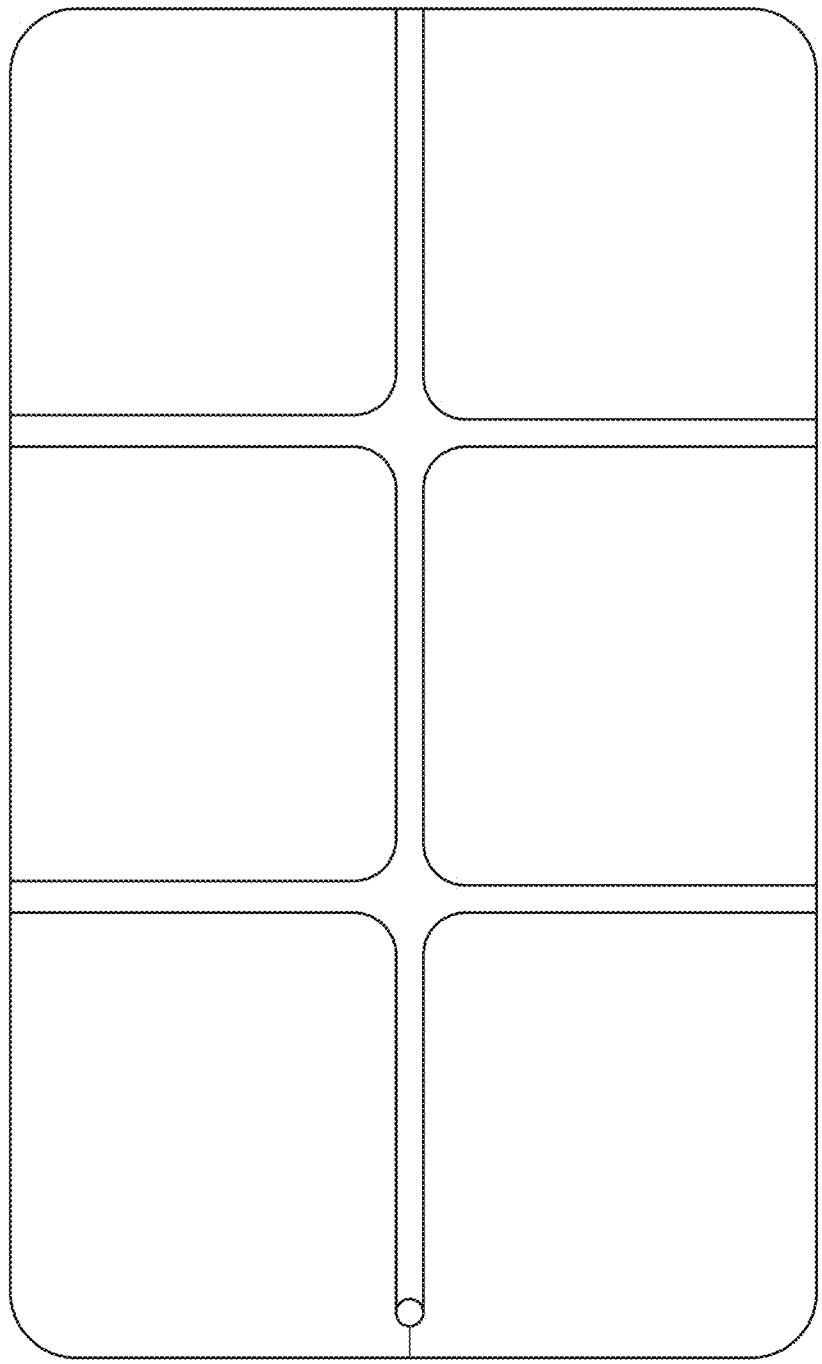
FIGS. 12-15 show various channel layout designs.
Figure 13:
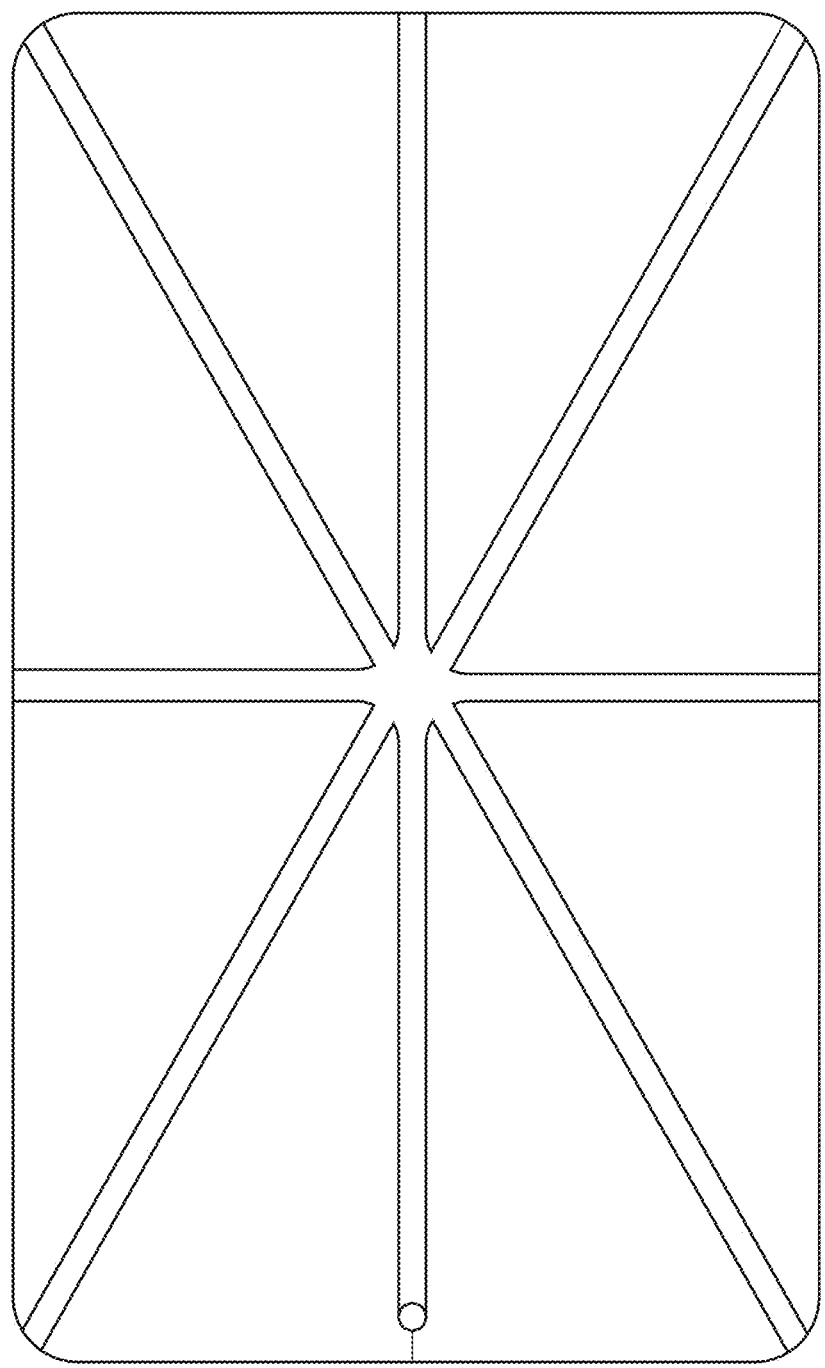
Figure 14:
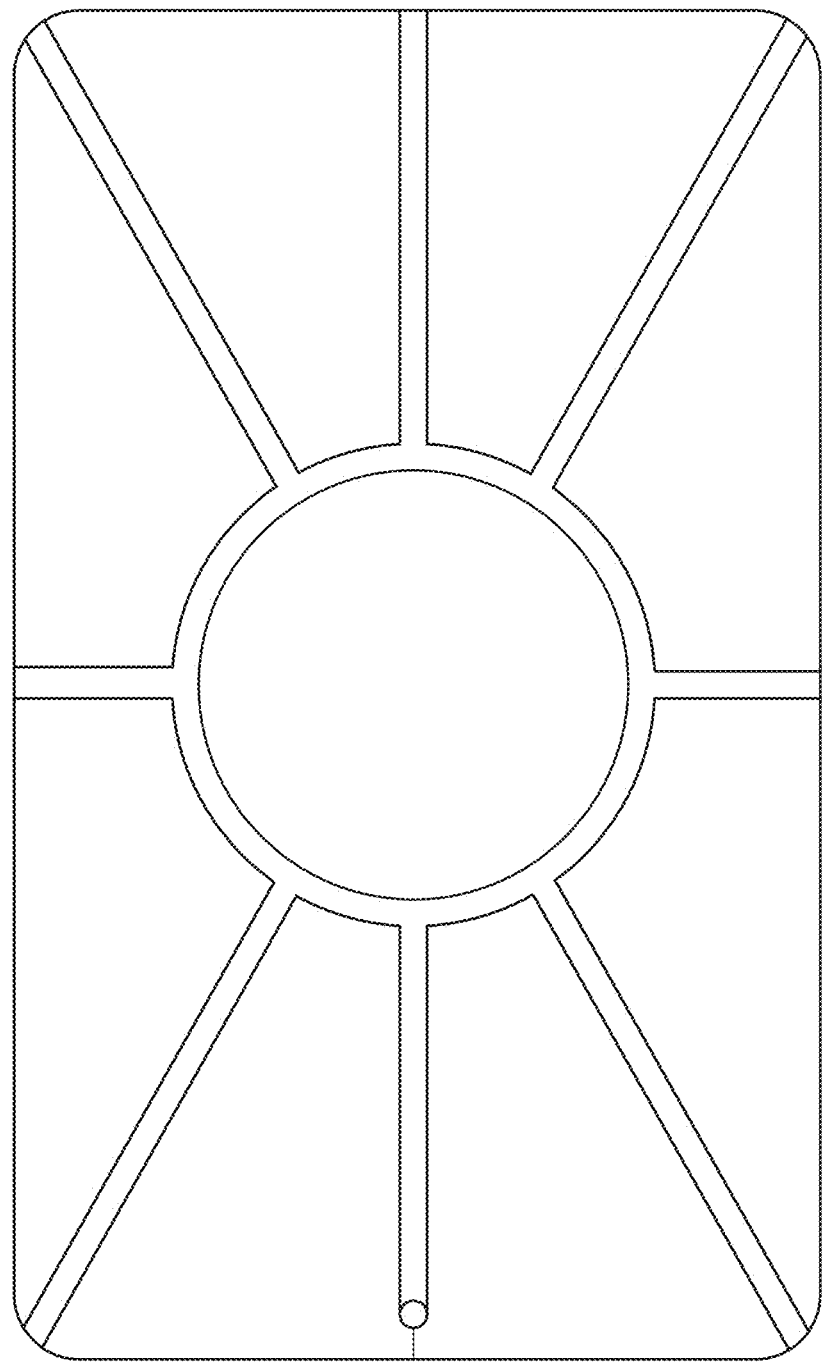
Figure 15:
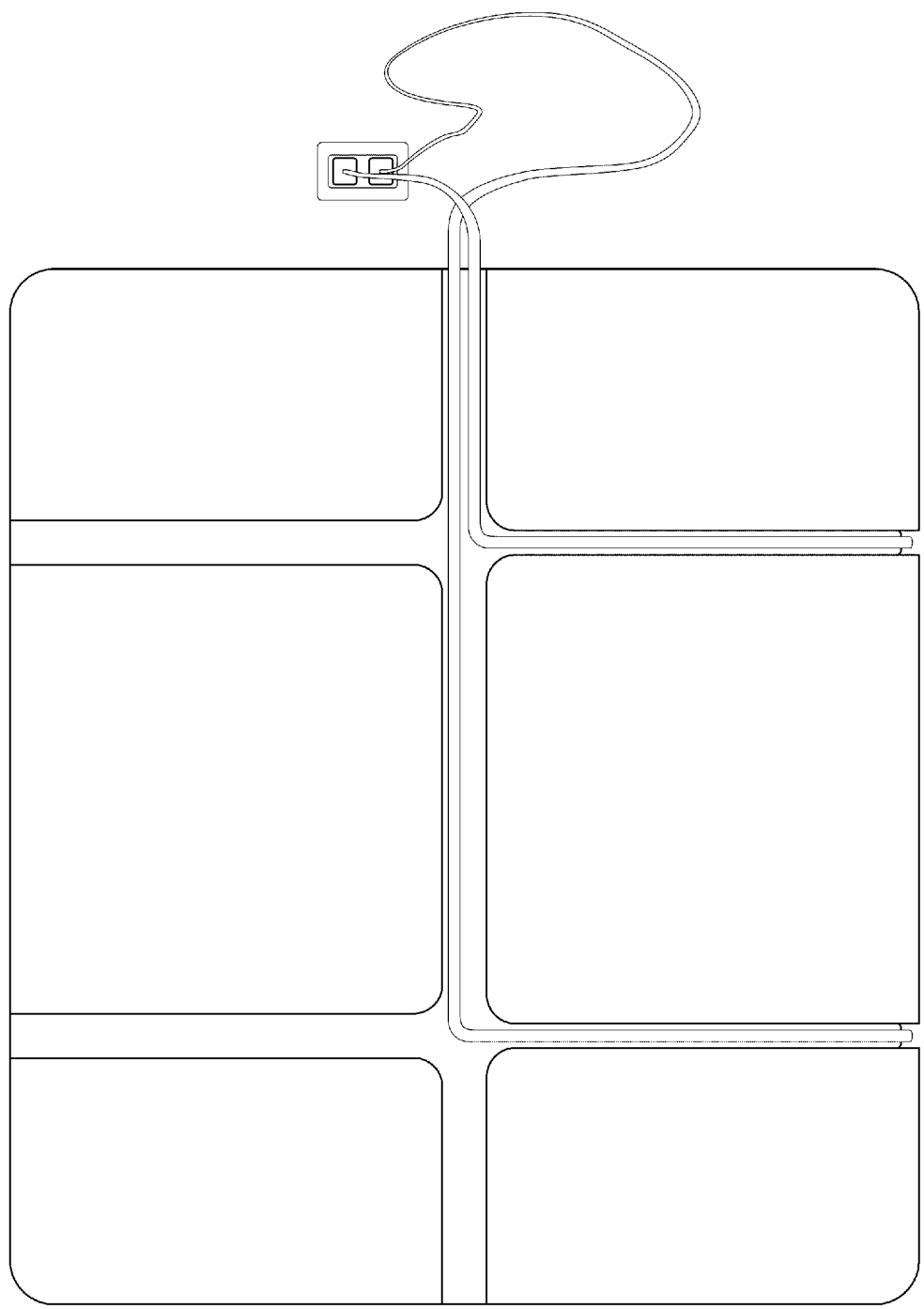
Figure 16:
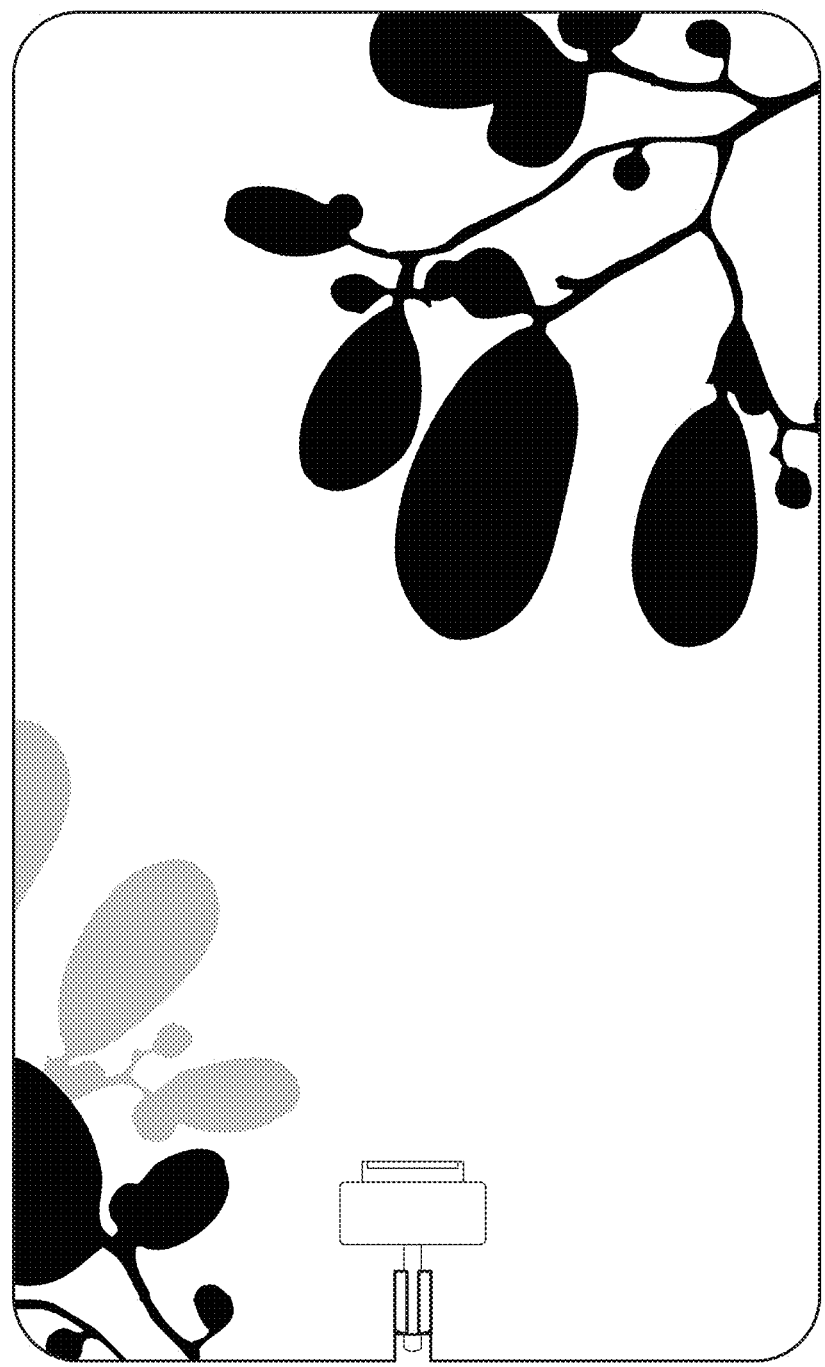
Figure 17:
Figure 18:
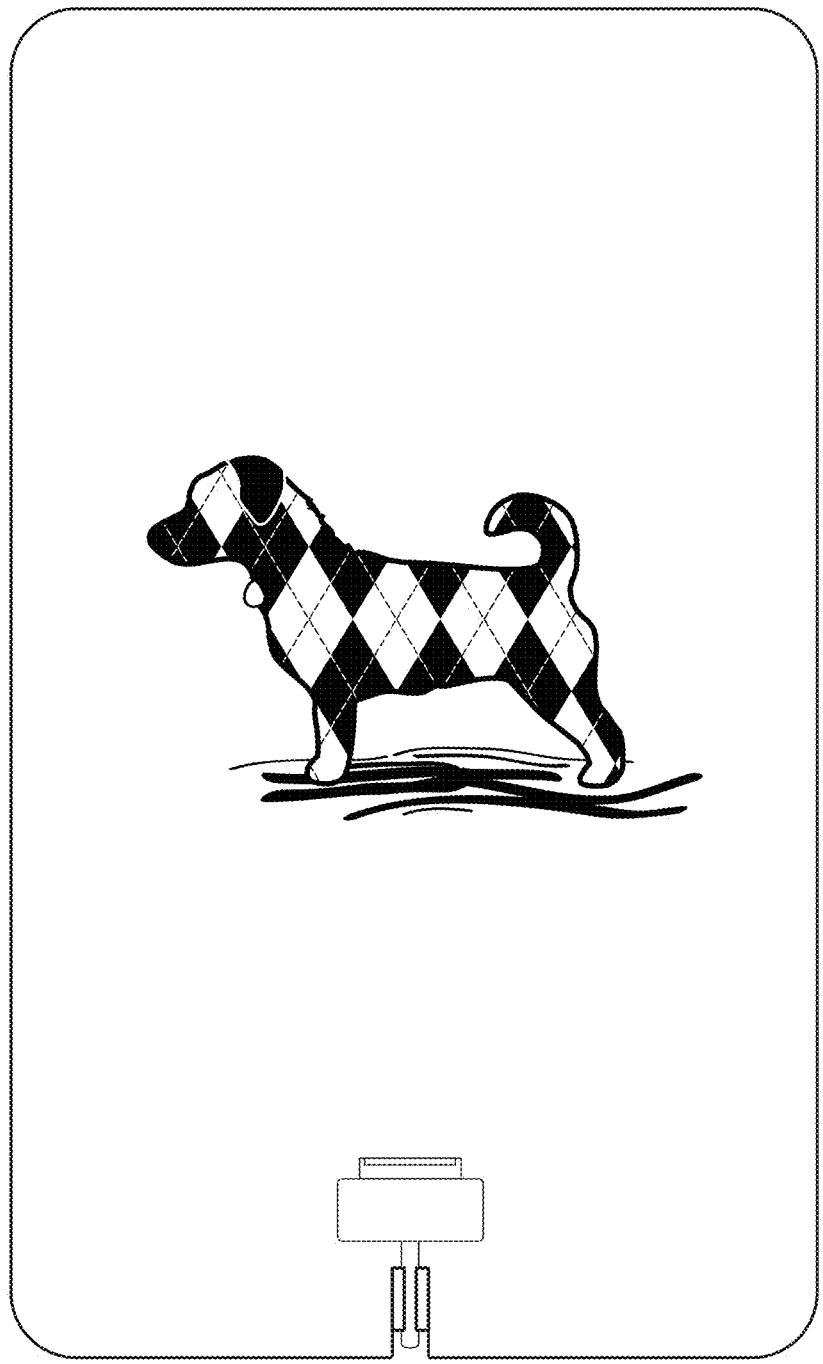
Figure 19:
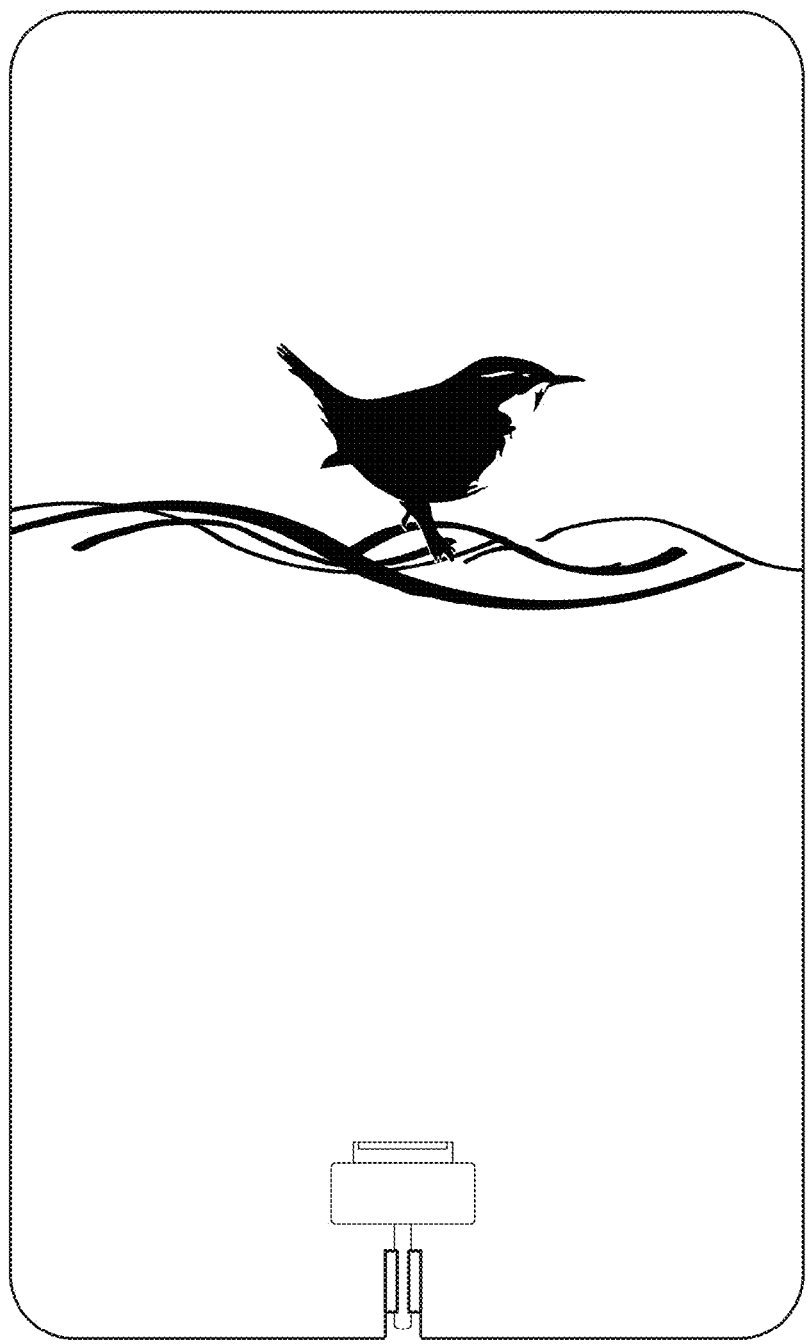
Figure 20:
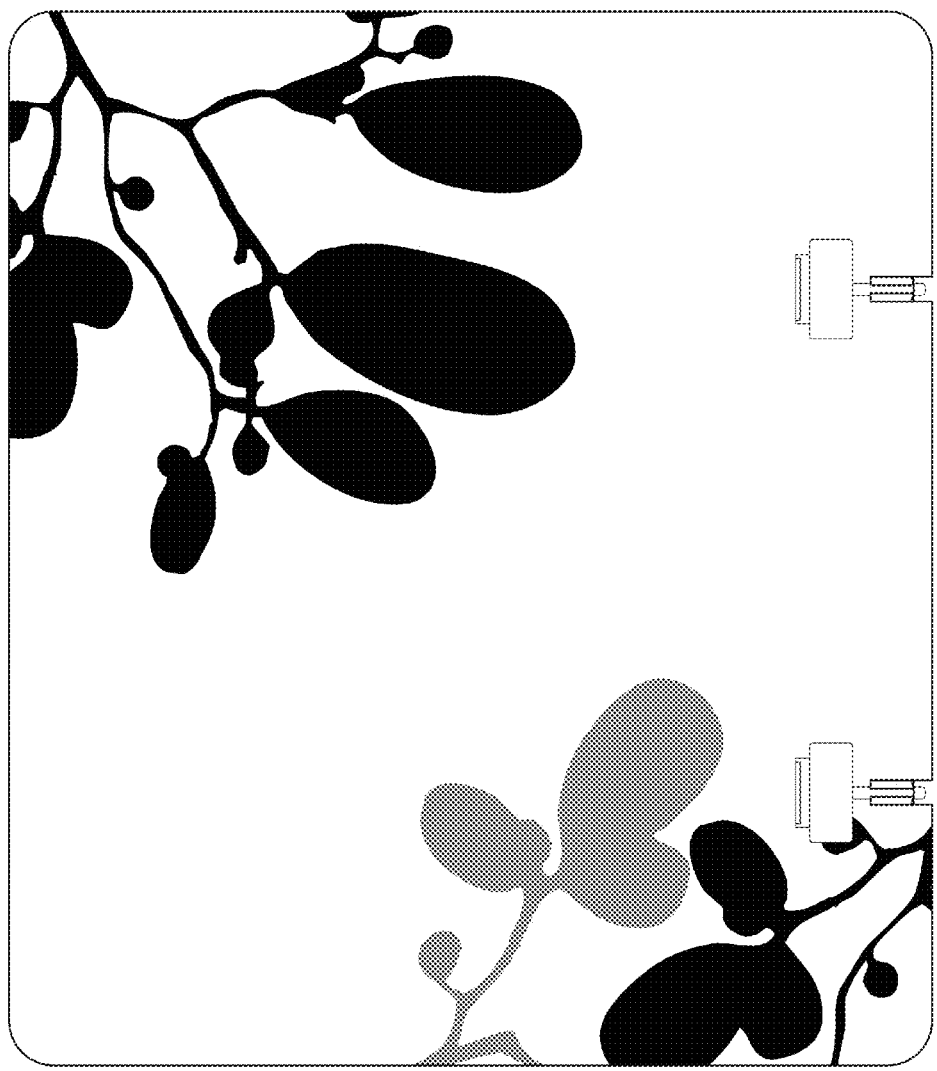

FIGS. 7 and 8 show a dual-device mat design using notch cutouts for cable entry points.

Additional Figures provided with this application illustrate different designs for mats and channels. For example, an embodiment whereby the channel is essentially enclosed is shown. A slit along the length of the channel allows a user to insert or place a cable into the channel. The material used to form the channel is sufficiently elastic so that the channel closes over the cable after insertion. Although the channels may be depicted with specific cross-section shapes such as circles, any type of cross-sectional shape can be used, as desired. In some embodiments, the cables can be provided permanently affixed to or integrated with the mat. However, a preferred embodiment allows the user to place existing types of cables into the mat channels, as described. Other mat and channel designs are possible.

Channels can be on the top surface of the mat instead of, or in addition to, the bottom surface of the mat. In different embodiments the channel structures can be at different depths of the mat. Channels may protrude from the mat's surfaces. The entry and exit points may include the notch cutout type, through hole or other designs. The mat may be decorated with graphics as shown in FIGS. 16-21. Other graphics or ways to decorate or change the appearance of the mats can be employed. Other variations are possible.

Although the description has been described with respect to particular embodiments thereof, these particular embodiments are merely illustrative, and not restrictive. It will also be appreciated that one or more of the elements depicted in the drawings/figures may also be implemented in a more separated or integrated manner, or even removed or rendered as inoperable in certain cases, as is useful in accordance with a particular application.

As used in the description herein and throughout the claims that follow, "a", "an", and "the" include plural references unless the context clearly dictates otherwise. Also, as used in the description herein and throughout the claims that follow, the meaning of "in" includes "in" and "on" unless the context clearly dictates otherwise.

While one or more implementations have been described by way of example and in terms of the specific embodiments, it is to be understood that the implementations are not limited to the disclosed embodiments. To the contrary, they are intended to cover various modifications and similar arrangements as would be apparent to those skilled in the art. Therefore, the scope of the appended claims should be accorded the broadest interpretation so as to encompass all such modifications and similar arrangements.

Thus, while particular embodiments have been described herein, latitudes of modification, various changes, and substitutions are intended in the foregoing disclosures, and it will be appreciated that in some instances some features of particular embodiments will be employed without a corresponding use of other features without departing from the scope and spirit as set forth. Therefore, many modifications may be made to adapt a particular situation or material to the essential scope and spirit.

What is claimed is:

1. A substantially flat mat including a top surface upon which can be placed an electronic device, wherein the device includes a connector for coupling the device to a cable, the mat comprising:
    a hole in the top surface of the mat to provide an entry point for the cable; and
    a channel in the mat for routing the cable to the connector of the device via the hole when the device is placed on the mat;
    at least one edge opening for the channel, wherein the edge opening allows the cable to pass out of the channel to protrude through an edge of the mat; and
    a slit running along at least a portion of a length of the channel, the slit allowing an opening from an exterior of the mat to the channel to allow the cable to be pushed into the channel through the slit.

2. The mat of claim 1, wherein the slit runs along the channel from the edge to the entry point.

3. A substantially flat mat including a top surface upon which can be placed an electronic device, wherein the device includes a connector for coupling the device to a cable, the mat comprising:
    a hole in the top surface of the mat to provide an entry point for the cable; and
    a channel in the mat for routing the cable to the connector of the device via the hole when the device is placed on the mat;
    a first channel segment joining the channel and providing a path for routing the cable to another edge on the mat, wherein at least a portion of the first channel segment runs perpendicular to the channel.

4. The mat of claim 3, wherein the mat is substantially rectangular having first, second, third and fourth edges, wherein the entry point is located near to one edge, wherein the first channel segment provides a path to the second edge, the mat further comprising:

a second channel segment providing a path to the third edge; and a third channel segment providing a path to the fourth edge.

\* \* \* \* \*